(12) United States Patent
Csanky et al.

(10) Patent No.: US 7,038,897 B2
(45) Date of Patent: May 2, 2006

(54) ARC FAULT DETECTION SYSTEM

(75) Inventors: Peter H. Csanky, Cobourg (CA);
Robert M. Ferino, Toronto (CA); Ivo M. Bordignon, Bolton (CA)

(73) Assignee: Honeywell International Inc., Morristown, NJ (US)

( * ) Notice: Subject to any disclaimer, the term of this patent is extended or adjusted under 35 U.S.C. 154(b) by 423 days.

(21) Appl. No.: 10/365,317

(22) Filed: Feb. 12, 2003

(65) Prior Publication Data
US 2004/0156153 A1 Aug. 12, 2004

(51) Int. Cl.
*H02H 9/08* (2006.01)
(52) U.S. Cl. .......................... 361/42; 361/43
(58) Field of Classification Search ............... 361/42, 361/43, 44, 45, 46, 47, 48, 49, 50
See application file for complete search history.

(56) References Cited

U.S. PATENT DOCUMENTS

| | | | |
|---|---|---|---|
| 4,297,740 A * | 10/1981 | Hagberg | 361/67 |
| 5,434,509 A | 7/1995 | Blades | |
| 5,477,150 A | 12/1995 | Ham, Jr. et al. | |
| 5,561,605 A * | 10/1996 | Zuercher et al. | 702/64 |
| 5,602,709 A * | 2/1997 | Al-Dabbagh | 361/85 |
| 6,128,169 A | 10/2000 | Neiger et al. | |
| 6,225,883 B1 | 5/2001 | Wellner et al. | |
| 6,268,989 B1 | 7/2001 | Dougherty et al. | |
| 6,275,044 B1 | 8/2001 | Scott | |
| 6,285,534 B1 | 9/2001 | Gibson et al. | |
| 6,307,453 B1 | 10/2001 | Wellner et al. | |
| 6,339,525 B1 | 1/2002 | Neiger et al. | |
| 6,362,628 B1 | 3/2002 | Macbeth et al. | |
| 6,373,257 B1 | 4/2002 | Macbeth et al. | |
| 6,377,055 B1 | 4/2002 | Macbeth et al. | |

(Continued)

FOREIGN PATENT DOCUMENTS

DE 199 30 685 A1 11/2000

*Primary Examiner*—Brian Sircus
*Assistant Examiner*—Danny Nguyen
(74) *Attorney, Agent, or Firm*—Birch, Stewart, Kolasch & Birch, LLP

(57) ABSTRACT

A system and method for an arc fault detection system for aircraft wiring system is disclosed. Upon detection of arc fault events, the system transmits a signal that may be sent to an existing circuitry of the aircraft electrical system, which disconnects the power to the circuits, thereby extinguishing the arc. The system can be either utilized as a stand-alone system or incorporated into existing products or systems. When an arc event occurs on a power cable, a broadband noise event is similarly induced upon the affected cable. The system first uses a pick-up coil (15) to sense and pick up this broadband signal from the power cable (5) of the wiring system, and then amplifies (17) the signal. The amplified signal is applied to a high-pass filter (20) to only pass frequency components above a predetermined frequency. The high-passed frequency components are then applied to band-pass filters (32–35), using a plurality of non-harmonically related center frequencies to generate narrow frequency slices of the signal. Each slice of the signal is rectified (42–45) to generate a d.c. level signal. Detection can be made for each d.c. level signal using level detectors (52–55). Power and ground sources are also applied to their narrow band-pass filters (31, 36), rectifiers (41, 46) and level detectors (51, 56). By using a logic matrix (60), an arc fault can be determined when all d.c. level signals from the event indicate detection, while signals from the power and ground sources indicate no system noise.

20 Claims, 4 Drawing Sheets

U.S. PATENT DOCUMENTS

| | | |
|---|---|---|
| 6,388,849 B1 | 5/2002 | Rae |
| 6,392,513 B1 | 5/2002 | Whipple et al. |
| 6,407,893 B1 | 6/2002 | Neiger et al. |
| 6,532,424 B1 * | 3/2003 | Haun et al. .................. 702/58 |
| 6,751,528 B1 * | 6/2004 | Dougherty ................. 700/293 |
| 2001/0029433 A1 | 10/2001 | Scott |
| 2001/0033469 A1 | 10/2001 | Macbeth et al. |
| 2001/0040458 A1 | 11/2001 | Macbeth et al. |
| 2002/0008950 A1 | 1/2002 | Kim et al. |
| 2002/0033701 A1 | 3/2002 | Macbeth et al. |
| 2002/0063565 A1 | 5/2002 | Stroth |
| 2002/0080003 A1 | 6/2002 | Pellon et al. |

* cited by examiner

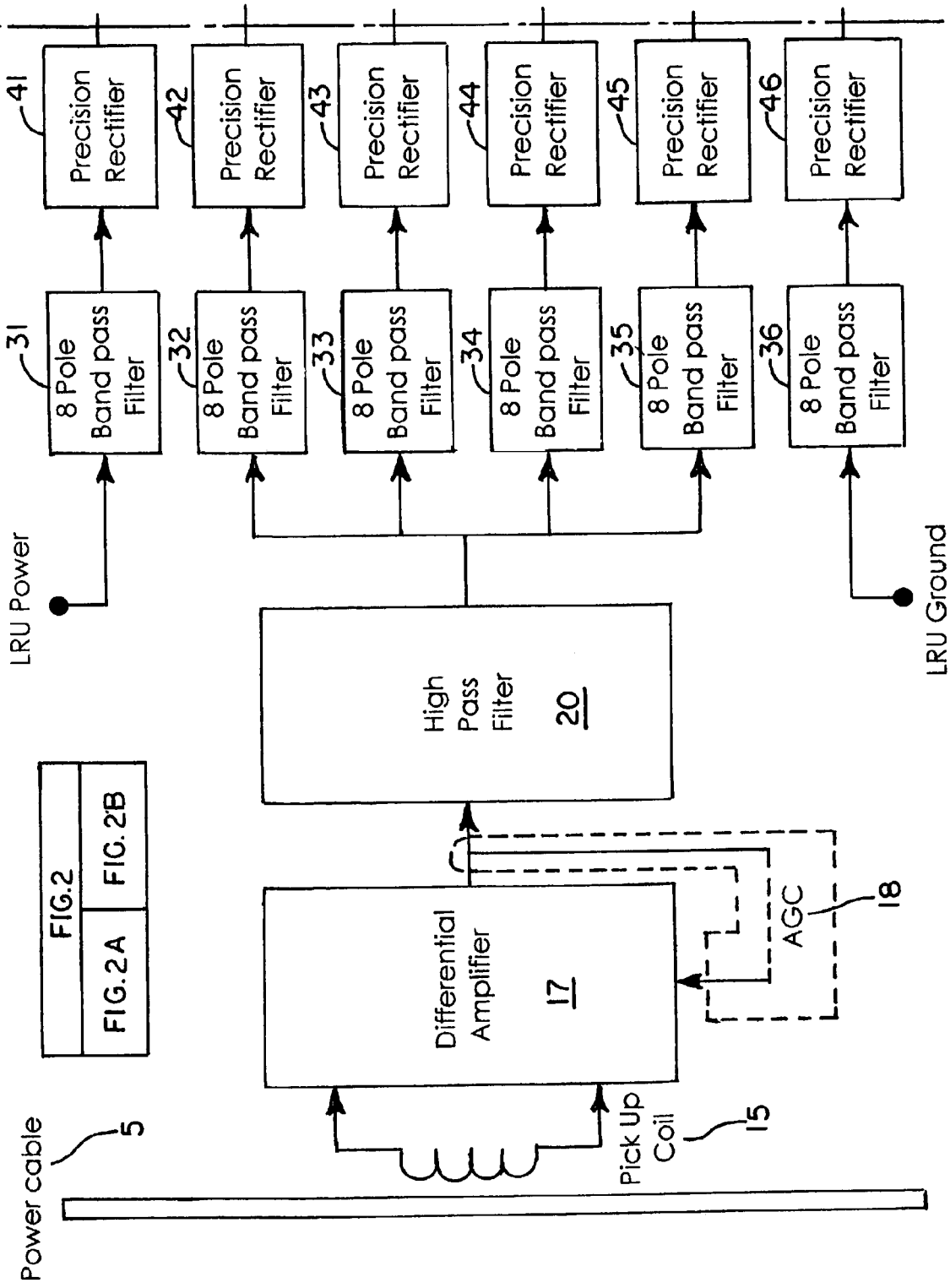

Table 1

| LRU Power | LRU Ground | ALL High Pass Filter Input # | Arc Fault Detection Output |
|---|---|---|---|
| 0 | 0 | 0 | 0 |
| 0 | 0 | 1 | 1 |
| 0 | 1 | 0 | 0 |
| 0 | 1 | 1 | 0 |
| 1 | 0 | 0 | 0 |
| 1 | 0 | 1 | 0 |
| 1 | 1 | 0 | 0 |
| 1 | 1 | 1 | 0 |

ARC FAULT DETECTION SYSTEM

RELATED FIELD

The present invention relates to arc fault detection systems and more particularly relate to arc fault detection systems for use in aircraft and aerospace environment.

ART BACKGROUND

Electronics and computer systems have become an integral and indispensable part of an aircraft system. While the use of modern technology for communication, control and navigation has made flying safer and more efficient, it also makes the aircraft more susceptible to arcing in its wiring. FIG. 1 is a simplified diagram illustrating an exemplary wiring system for an aircraft. Such exemplary electrical wiring system 1 may include major systems such as power 2, lights 3, and communication 4. For power system 2, it may include sub-systems such as battery, generator and alternator 21, and circuit breakers 22. The communication system may include radio 23 and transponder 24 sub-systems. As can be appreciated, all the systems and sub-systems require wiring to connect the on-board components. Massive amount of wiring, however, also create potential hazards. Many aircraft accidents have been attributed to smoke and fires due to electrical arcing in the aircraft wiring, with the attendant loss of life and damage to property. Heat, arcs or electrical ignition are often caused by loose connections, broken or shorted wires in the power distribution system. In aircraft wiring, vibration, moisture, temperature extremes, improper maintenance, and insulation breakdown all contribute to wiring failure. This may lead to arcing and may ignite combustible components in the aircraft.

Electrical arcing may occur as a result of flexing in the airplane during turbulence, take-off or landing. It may also occur as a result of wire shifting or chafing. It may occur in flight, which could potentially cause smoke, fire and explosion.

In addition, our aircraft fleet is aging and has become even more susceptible to potential faults due to arc faults in the aging wire insulation. This problem is quite predictable, since as the wiring ages, the insulation becomes brittle and begins to break down. However, since the wiring is all encompassed in the aircraft harness, it is generally beyond the maintenance crew's reach. Therefore, in the face of aging fleets, it has become desirable to be able to detect arc faults and shut off the circuit that causes the arc.

While numerous conventional approaches to arc fault detection have been presented, such conventional approaches have not been entirely satisfactory for various reasons, such as failure to detect different types of arcs, vulnerability to generate false alarms, delayed detection and reaction, or simply inaccurate detection. Many rely on conventional time-domain signals and analyses, which compromise the time a system takes to do a detection, while others are only capable of detecting arcs of a single frequency band.

Therefore, it has become desirable to have an arc fault detection system that can detect arcing expediently.

It is also desirable to have an arc fault detection system that can achieve high degree of false alarm immunity.

It is further desirable to have an arc fault detection system that can be easily implemented with the aircraft wiring system.

SUMMARY OF THE PRESENT INVENTION

A system and method for an arc fault detection system for aircraft wiring system is disclosed. Upon detection of arc fault events, the system transmits a signal that may be sent to an existing circuitry of the aircraft electrical system, which disconnects the power to the circuits, thereby extinguishing the arc. The system can be either utilized as a stand-alone system or incorporated into existing products or systems. When an arc event occurs on a power cable, a broadband noise event is similarly induced upon the affected cable. The system first uses a pick-up coil to sense and pick up this broadband signal from the power cable of the wiring system, and then amplifies the signal. The amplified signal is applied to a high-pass filter to only pass frequency components above a predetermined frequency. The high-passed frequency components are then applied to band-pass filters, using a plurality of non-harmonically related center frequencies to generate narrow frequency slices of the signal. Each slice of the signal is rectified to generate a d.c. level signal. Detection can be made for each d.c. level signal using level detectors. Power and ground sources are also applied to their narrow band-pass filters, rectifiers and level detectors. By using a logic matrix, an arc fault can be determined when all d.c. level signals from the event indicate detection, while signals from the power and ground sources indicate no system noise.

BRIEF DESCRIPTION OF THE DRAWINGS

FIG. 2 comprising FIGS. 2A and 2B is a simplified block diagram illustrating an exemplary embodiment of the present invention.

Table 1 is a truth table for an exemplary detection logic matrix 60.

DETAILED DESCRIPTION OF THE PREFERRED EMBODIMENTS

A system and method for an arc fault detection system for aircraft wiring system is disclosed. In the following description, numerous specific details are set forth to provide a full understanding of the present invention. In other instances, well-known devices or components have not been shown in detail so as to avoid unnecessarily obscuring the present invention.

Figure 1:
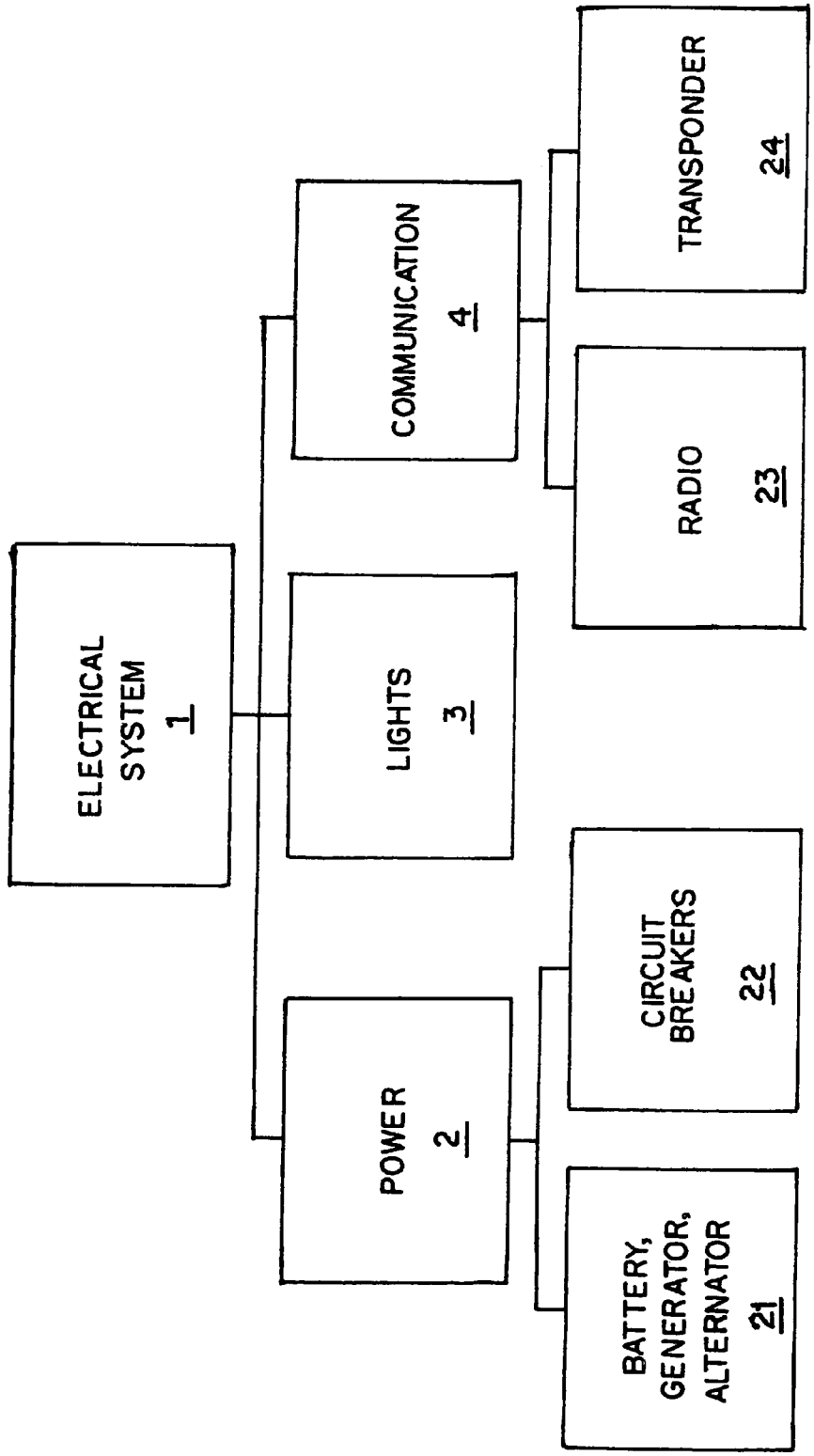
FIG. 1 is a simplified block diagram illustrating an exemplary aircraft electrical system.
Figure 2B:
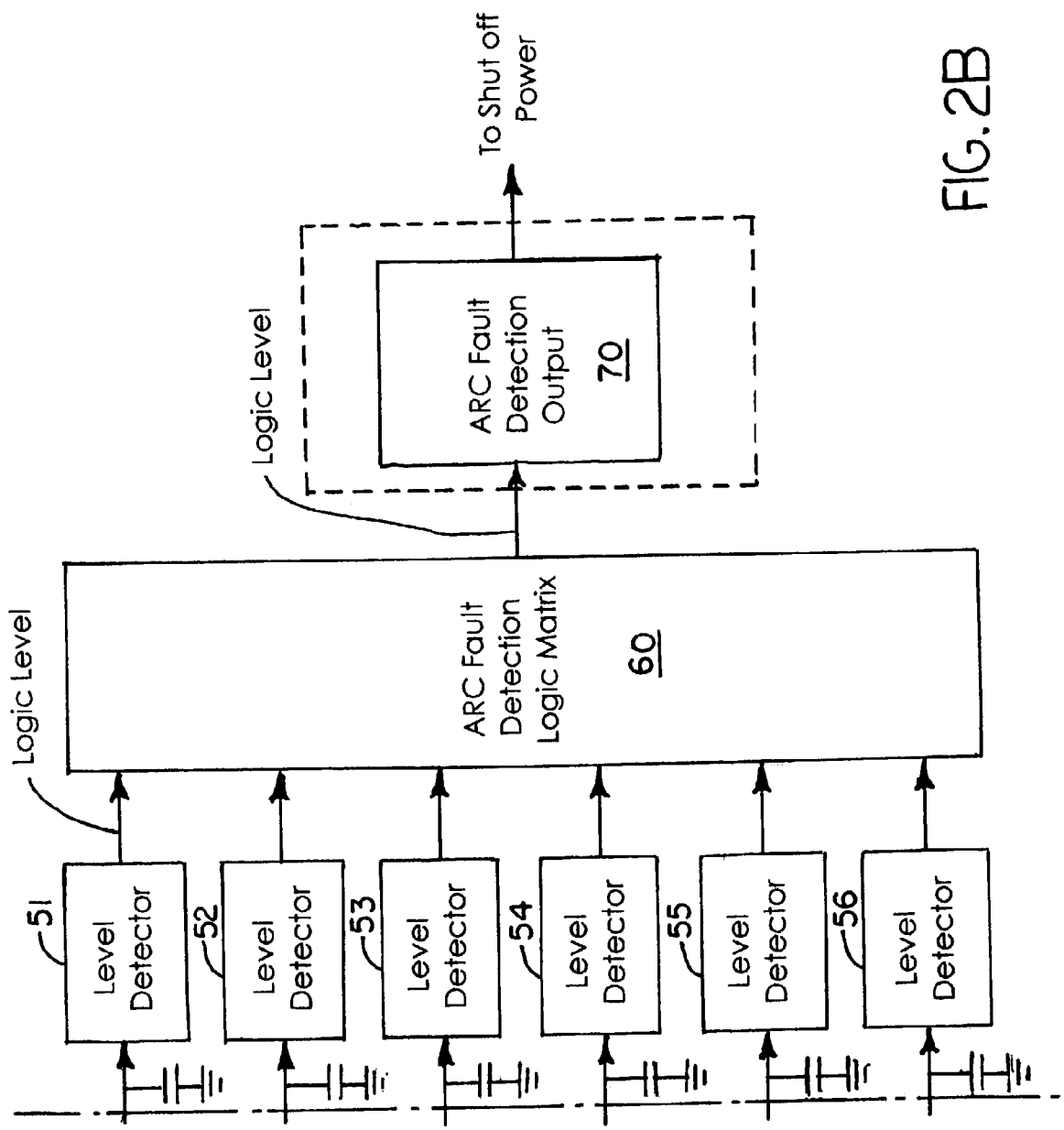

Referring to FIG. 2, a simplified block diagram illustrating an exemplary embodiment of the present invention is shown. From the left-hand side of FIG. 2, power cable 5 represents the cables from aircraft wiring and power distribution system. When an arc event occurs on a power cable, a broadband noise event is similarly induced upon the affected cable. Power cable 5 is passed through pick-up sensor 15, which is broadly tuned to the frequency band between 2 and 15 KHz to detect broadband signals on power cable 5. Broadband signals on the wire that are picked up by sensor 15 are applied to differential amplifier 17 for amplification and preventing overloading, preferably with the help of the automatic gain control 18 ("AGC") that can prevent saturation. The output from differential amplifier 17, which is analog, has a wide spectrum between 0 to 20 KHz.

Signals from differential amplifier 17 are applied to high-pass filter 20 to eliminate frequency components below certain frequency range, which can be determined based on aircraft specifications. For example, since some aircraft have used variable frequency power generators with 400 Hz, their signals may fluctuate between 350 Hz to 800 Hz. Therefore, signals below 800 Hz are to be filtered out by high pass filter 20 for those aircraft, such that the subsequent detection filters are not saturated by those signals from their own wiring and power generation.

After filtering by high pass filter 20, four narrow band-pass filters 32, 33, 34, 35 are connected to receive the filtered output. Each narrow band-pass filter 32, 33, 34, 35 is tuned to a separate band-pass frequency between 2 and 15 KHz, so that each essentially takes a spectrum slice in the signals' frequency domain. To eliminate man-made sources of noise from the wire, which are harmonically related, each band-pass frequency is selected so that it is not harmonically related to another band-pass frequency. Each of the narrow band-pass filters are preferably a multi-pole band-pass filter, in order to achieve narrow band-passing. Preferably, center frequencies of 2 KHz, 3 KHz, 5 KHz and 7 KHz are selected for band pass filters 32, 33, 34, 35, which are preferably implemented with 8-pole band-pass filters.

Each of the output signals from multi-pole band-pass filters 32, 33, 34, 35 is applied to precision rectifier 42, 43, 44, 45, respectively. Each precision rectifier 32, 33, 34, 35 provides a d.c. level output, of which the level is commensurate with the arc spectra within each band-pass filter frequency band. At the output of each precision rectifier 42, 43, 44, 45, a capacitor is preferably connected between the output and the ground.

The d.c. level output from each precision rectifier 42, 43, 44, 45 is low-passed filtered and drives separate precision comparators acting as level detector 52, 53, 54, 55. Level detectors 52, 53, 54, 55 generate logic-level outputs which are individually fed into arc fault detection logic matrix 60.

To discriminate against false alarms like common-mode electromagnetic noise and lightning, other sets of narrow, multi-pole band pass filter, rectifier, and level detector (31, 41, 51 and 36, 46, 56) are also used to monitor both the power and ground lines. The output signals from their level detectors 51, 56 are also fed into arc fault detection logic matrix 60.

An exemplary system of the present invention may be physically realized using the following components: Differential amplifier 17 may be implemented with a device, Part No. AD797, from Analog Devices, Inc. Each of multi-pole band pass filters 31–36 may be a device, Part No. MAX274, from Maxim. Each of precision rectifiers 41–46 may be a device, Part No. TL071, from Texas Instruments. Each of level-detectors 51–56 may be a device, Part No. LM211, from National Semiconductor. High pass filter 20 is implemented using typical passive components.

Arc fault detection logic matrix 60 generates a detection signal, which is preferably a logic-level signal, to indicate the presence of an arc fault. Such detection signal can further be applied to an arc fault detection output drive stage 70, which generates a control signal to shut off the power line. It should be noted that output drive stage 70 is preferably utilized to provide additional signal conditioning, buffering or handling, such that the output from the drive stage 70 can be appropriately used downstream. An arc fault is detected only if there is a valid signal from all four level detectors 52, 53, 54, 55, but not from level detectors 51, 56, associated with the power and ground lines. Also, as previously described, since most nuisance noise events generated within the aircraft would exhibit spectra that would be harmonically related, e.g. from switching power supplies, such noise would not appear in all four pick-up band pass filters 42, 43, 44, 45 simultaneously. Therefore, such nuisance noise would be rejected by detection logic matrix 60 (to be further described in connection with Table 1).

Figure 3:
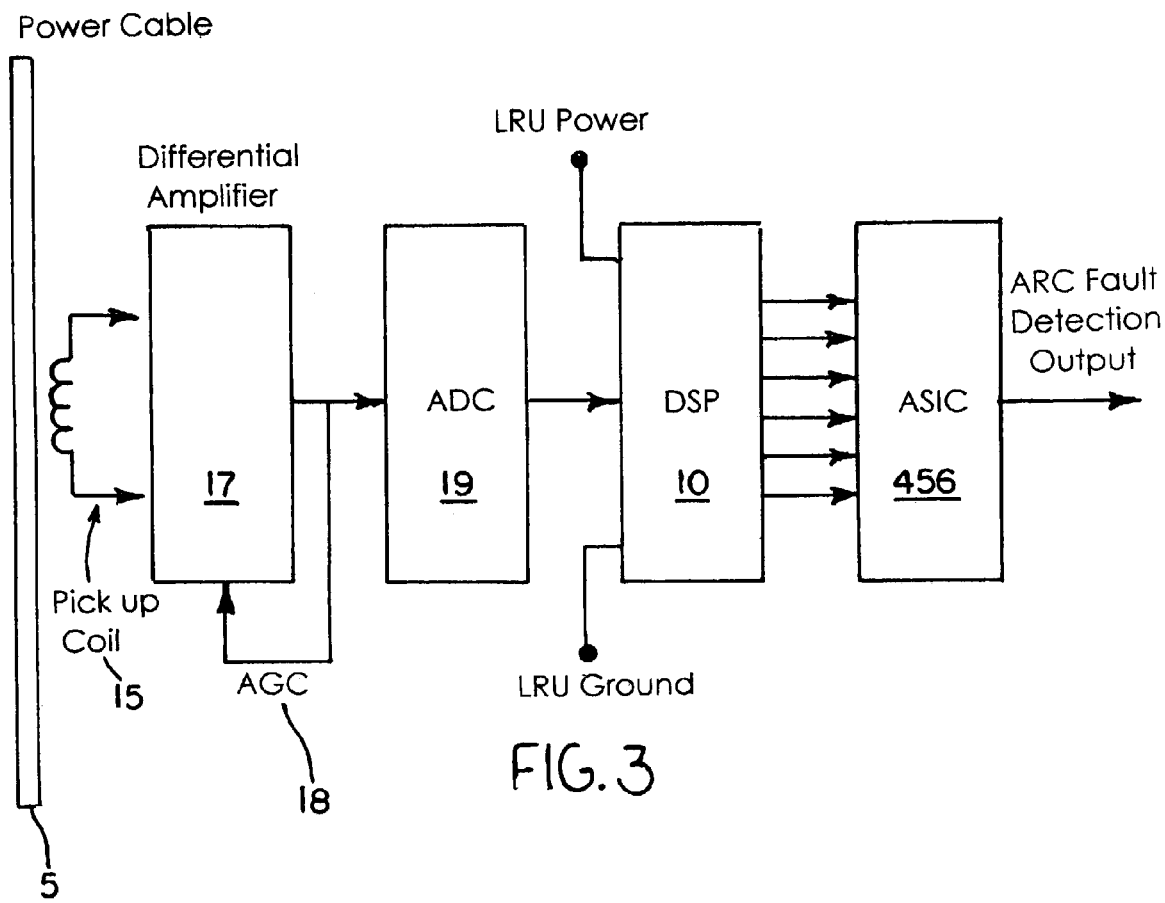
FIG. 3 is a simplified block diagram illustration an exemplary embodiment of the present invention implemented with a digital signal processor ("DSP") and a semi-custom integrated circuit ("ASIC").

Reference is now turned to FIG. 3, where a simplified block diagram of another exemplary embodiment of the present invention is illustrated. The aforementioned functions achieved by the high pass filter, narrow band pass filters, rectifiers, level detectors, logic matrix and detection output can readily be implemented by a programmable digital signal processor 10. Of course, an analog-to-digital converter (ADC) is implemented after differential amplifier 17 to provide signal conversion from analog to digital format.

With respect to logic matrix 60, Table 1 illustrates a truth table for an exemplary arc fault detection logic. The columns entitled "LRU Power" and "LRU Ground" represent whether there is system noise, other than an arc on the wire that is being monitored. A "1" indicates system noise is present, which may be a lightning strike, electromagnetic interference ("EMI") etc. By monitoring system noise, it can reduce the probability of a false arc fault trip.

The column entitled "All High Pass Filter Input #" represents whether ALL outputs from the Level Detectors associated with the High Pass Filter are logic "1". A "1" indicates that all criteria have been met in determining that a potential arc has been detected on the power cable.

The last column entitled "Arc Fault Detection Output" represents whether an arc on the power cable has been detected and that the power to the load should be terminated and shut off. Note that, according to the exemplary truth table of Table 1, an arc is detected only when all high pass filters are "1" in the absence of any system noise from LRU Power and Ground.

The truth table shown in Table 1 represents an exemplary and basic implementation of the detection logic matrix 60. It can be physically realized using a multiple input NAND gate (with inverters for the LRU Power and LRU Ground inputs), or with a simple micro-controller, which provides flexibility and convenience in design and implementation.

In accordance with multiple frequency domains of the present invention, multiple cycles of assessment of a potential event can be achieved by using frequency domain with multiple bands in parallel. The filtering, rectifying and level detection for each frequency band may be repeated in order to obtain a larger sample. Even at 2 KHz, a cycle may only take-about 0.5 millisecond. More cycles allow more signals to go into the capacitors, build up the charges, raise the voltages on the capacitors, and alter the state of the level detector based on the voltage level.

In accordance with the present invention, the detection system is able to discriminate against nuisance trips inherent in the aerospace environment, while being able to determine valid arc faults in a very short period of time after occurrence of the arc.

In order to detect signals on the wiring system, pick-up sensor 15 is preferably a magnetic pick-up coil, because it provides inductive coupling while maintaining physical isolation between the detection system and the wiring system. Additionally, a current sensor may be used to detect any current difference, which may indicate a potential arc fault.

We claim:

1. An arc fault detection system to detect an arc event in aircraft wiring, comprising:

a pick-up sensor coupled to said wiring, being adapted to detect an event on said wiring;

a differential amplifier coupled to said pick-up sensor, being adapted to amplify an output from said pick-up sensor;

a high pass filter coupled to said differential amplifier, being adapted to pass output from said differential amplifier above a predetermined frequency;

a plurality of first multi-pole band pass filters coupled to said high pass filter, each of said first multi-pole band pass filters being adapted to pass output from said high pass filter within a predetermined frequency band, each frequency band being non-harmonically related to each other of said first band pass filters;

a plurality of first rectifier coupled to said plurality of first multi-pole band pass filters, each of said first rectifiers being adapted to generate a d.c. output based on an arc spectrum from a corresponding one of said first multi-pole band pass filters;

a plurality of first level detectors coupled to said plurality of first rectifiers, each of said first level detectors being adapted to generate a logic level output based on an output from a corresponding one of said first rectifiers;

a plurality of second multi-pole band pass filters coupled to power and ground terminals, each of said second multi-pole band pass filters being adapted to pass output from said power and ground terminals within a predetermined frequency band;

a plurality of second rectifiers coupled to said plurality of second multi-pole band pass filters, each of said second rectifiers being adapted to generate a d.c. output based on an arc spectrum from a corresponding one of said second multi-pole band pass filters;

a plurality of second level detectors coupled to said plurality of second rectifiers, each of said second level detectors being adapted to generate a logic level output based on an output from a corresponding one of said second rectifiers; and a decision logic unit coupled to outputs of said plurality of first and second level detectors, being adapted to generate a detection signal only when said first level detectors indicate a valid detection, while said second level detectors indicate no detection.

2. The detection system of claim 1, further comprising:
a detection output unit coupled to said decision logic unit, being adapted to generate a control signal based on said detection signal, said control signal being adapted to cause power in the aircraft wiring to shut off.

3. The detection system of claim 2, further comprising:
an automatic gain control ("AGC") system coupled to said differential amplifier to prevent saturation;
a capacitor coupled to an output of each of said first and second rectifiers.

4. The detection system of claim 2, wherein said high band pass filter is adapted to filter out signal frequency below 800 Hz.

5. The detection system of claim 2, wherein:
said pick up sensor is one of a magnetic sensor and a current sensor, coupled to said wiring, being adapted to pick up events within a frequency between 2 KHz and 15 KHz.

6. The detection system of claim 1, wherein said plurality of first multi-pole band pass filters comprises an 8-pole band pass filter, having non-harmonically related center frequency.

7. The detection system of claim 2, wherein said plurality of first multi-pole band pass filters comprises an 8-pole band pass filter, having non-harmonically related center frequency.

8. The detection system of claim 6, wherein said first 8-pole band pass filters have center frequencies at 2, 3, 5, 7 KHz, respectfully.

9. The detection system of claim 1, wherein said first and second rectifiers are adjustable.

10. The detection system of claim 1, wherein said first and second level detectors are adjustable.

11. An arc fault detection system to detect an arc event in aircraft wiring, comprising:
a pick-up sensor coupled to said wiring, being adapted to detect an event on said wiring;
a differential amplifier coupled to said pick-up sensor, being adapted to amplify an output from said pick-up sensor;
an analog-to-digital converter ("ADC") coupled to said differential amplifier, being adapted to convert an analog output from said differential amplifier to a digital signal;
a digital signal processor ("DSP") coupled to said ADC, being programmed to perform:
high pass filtering by passing output from said differential amplifier above a predetermined frequency;
first multi-pole band pass filtering of a plurality of center frequencies by passing output after said high pass filtering within a predetermined frequency band, each frequency band being non-harmonically related to each other in said first filtering;
second multi-pole band pass filtering of a plurality of center frequency by passing output from said power and ground terminals within a predetermined frequency band;
an integrated circuit coupled to said DSP, being adapted to perform:
first rectifying of a plurality of output after said first multi-pole band pass filtering by generating a d.c. output based on a corresponding arc spectrum from said first multi-pole band pass filtering;
first level detecting of each output after said first rectifying by generating a logic level output based on a corresponding output from said first rectifying;
second rectifying of a plurality of output after said second multi-pole band pass filtering by generating a d.c. output based on a corresponding arc spectrum from said second multi-pole band pass filtering;
second level detecting of each output after said second rectifying by generating a logic level output based on a corresponding output from said second rectifying; and
generating a detection signal only when said first level-detecting indicates a valid detection, while said second level-detecting indicates no detection.

12. An arc fault detection system of claim 11, wherein said integrated circuit is further adapted to output a control signal based on said detection signal, said control signal being adapted to cause power in the aircraft wiring to shut off.

13. An arc fault detection system of claim 11, wherein each of said plurality of first multi-pole band pass filtering comprises using an 8-pole band pass filter, having non-harmonically related center frequency.

14. An arc fault detection system of claim 12, wherein each of said plurality of first multi-pole band pass filtering comprises using an 8-pole band pass filter, having non-harmonically related center frequency.

15. A method of detecting an arc fault event in aircraft electrical wiring, comprising the steps of:
  a) sensing a signal in said wiring;
  b) differentially amplifying the signal picked up from said wiring;
  c) high-pass filtering an output from said step of differentially amplifying above a predetermined frequency;
  d) band-pass filtering the signal from said step of high-pass filtering, with a plurality of non-harmonically related center frequencies to generate a plurality of narrow frequency slices that represent a wiring frequency spectrum, and band-pass filtering a power terminal signal and ground signal with non-harmonically related center frequencies to generate narrow frequency slices that represent frequency spectrum for the power terminal and ground signals;
  e) rectifying each of said frequency slices to generate a d.c. level signal for each frequency slice;
  f) detecting a logic level for each of said d.c. level signal; and
  g) determining that an arc fault is present when all logic levels for the wiring frequency spectrum indicate detection and when logic levels for the power terminal and ground signal frequency spectrum indicate no detection.

16. The method of claim 15, further comprising:
  outputting a detection control signal if arc fault is determined.

17. The method of claim 15, wherein said non-harmonically center frequencies are 2, 3, 5, 7 KHz.

18. The method of claim 16, wherein said non-harmonically center frequencies are 2, 3, 5, 7 KHz.

19. The method of claim 15, wherein said step of band-pass filtering comprises using 8-pole band pass filters.

20. The method of claim 16, wherein said step of band-pass filtering comprises using 8-pole band pass filters.

* * * * *